(12) United States Patent
Kawakatsu et al.

(10) Patent No.: US 7,719,042 B2
(45) Date of Patent: May 18, 2010

(54) SEMICONDUCTOR DEVICE

(75) Inventors: Yasuhiro Kawakatsu, Kanagawa (JP);
Hitoshi Abiko, Kanagawa (JP);
Hirofumi Nikaido, Kanagawa (JP);
Nobuyuki Katsuki, Kanagawa (JP);
Michihiro Kobayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 212 days.

(21) Appl. No.: 11/812,192

(22) Filed: Jun. 15, 2007

(65) Prior Publication Data

US 2008/0001197 A1    Jan. 3, 2008

(30) Foreign Application Priority Data

Jul. 3, 2006    (JP)    ............................. 2006-183519

(51) Int. Cl.
H01L 27/108    (2006.01)
(52) U.S. Cl. .................. 257/296; 257/532; 257/204
(58) Field of Classification Search ................ 257/204, 257/296, 532
See application file for complete search history.

(56) References Cited

U.S. PATENT DOCUMENTS 7,349,240 B2*    3/2008    Oki ............................. 365/154
2001/0050409 A1*    12/2001    Kasahara ..................... 257/532
2002/0030243 A1*    3/2002    Mikawa et al. .............. 257/532
2004/0137693 A1*    7/2004    Kim ........................... 438/393
2005/0082636 A1*    4/2005    Yashima et al. ............. 257/532
2006/0170023 A1*    8/2006    Nikaido et al. .............. 257/296
2006/0289917 A1*    12/2006    Fujiwara et al. ............. 257/296

FOREIGN PATENT DOCUMENTS

| JP | 02-144964 | 6/1990 |
| JP | 02-310958 | 12/1990 |
| JP | 2004-266010 | 9/2004 |
| JP | 2005-019831 | 1/2005 |
| JP | 2005-183420 | 7/2005 |

* cited by examiner

*Primary Examiner*—Thao X Le
*Assistant Examiner*—Geoffrey Ida
(74) *Attorney, Agent, or Firm*—McGinn IP Law Group, PLLC

(57) ABSTRACT

A lower electrode projects outward from a common end face of an upper electrode and a capacitor film. A protective film, which is made of a different material from the capacitor film, is deposited on top of a part of the lower electrode outside the end face. The protective film also extends to the position at a certain distance inward from the end face, so that it is placed between the capacitor film and the lower electrode. The capacitor film thereby has a stepped surface near the end face due to the presence of the protective film, which suppresses the progress of damage during etching of the upper electrode and the capacitor film. Further, the protective film prevents the occurrence of damage in the lower electrode.

19 Claims, 10 Drawing Sheets

RELATED ART

US 7,719,042 B2

SEMICONDUCTOR DEVICE

BACKGROUND OF THE INVENTION

1. Field of the Invention

The present invention relates to a semiconductor device including a capacitor element of an MIM structure and, particularly, to a semiconductor device such as an SRAM composed of a plurality of memories cells.

2. Description of Related Art

A CMOS (Complementary Metal Oxide Semiconductor) type SRAM (Static Random Access Memory), which is a semiconductor device, is composed of a plurality of memory cells arranged in an array. A memory cell 100 includes two pMOS-FETs (Field Effect Transistors) 101 and 102 and four nMOS-FETs 103 to 106 as shown in FIG. 5.

The nMOS-FETs 105 and 106 are switching transistors for making an access to a particular bit cell from a peripheral circuit such as a sense amplifier. The nMOS-FETs 103 and 104 and the pMOS-FETs 101 and 102 form a part that actually stores information.

A portion to connect the gates of a pair of nMOS-FETs and a pMOS-FET with the drains of another pair of nMOS-FETs and a pMOS-FET is called a node or a node line. It is also called cross coupling because they appear to cross each other in a circuit diagram.

If a radiation is incident on the memory cell 100 of an SRAM, an electron-hole pair (e-h pair) is generated as shown in FIG. 6. Because electrons move to the n-layer and holes move to the p-layer, a reverse-biased PN junction is temporarily short-circuited, so that charges flow from a node electrode into a depletion layer. As a result, the charges in a storage node are lost and the information stored in the memory cell 100 is inverted. This is called soft error.

In order to avoid the soft error, in a memory cell 110 shown in FIG. 7, capacitor elements 111 and 112 having larger capacitance than a charge which is generated due to a ray are added to the nodes to thereby prevent data breakdown in the electron-hole pair generated due to the ray (see Japanese Unexamined Patent Application Publication No. 2005-183420, for example).

In the SRAM 120 which is disclosed in Japanese Unexamined Patent Application Publication No. 2005-183420, a metal line used as a node line serves also as a lower electrode 122 of a capacitor element 121 as shown in FIGS. 8 and 9. Specifically, a capacitor film 123 and an upper electrode 124 are stacked on top of the lower electrode 122, which is the node line, thereby forming the capacitor element 121 of the MIM (Metal-Insulator-Metal) structure. The capacitor element 121 is added to the node of the memory cell.

A method of manufacturing the capacitor element 121 having the above-described structure is briefly described hereinafter with reference to FIGS. 10A to 10D. Referring first to FIG. 10A, the lower electrode 122, which is made of tungsten or the like, is formed to project outward from the end faces of the upper electrode 124 and the capacitor film 123.

Referring next to FIG. 10B, a capacitor material 123a, which is a capacitor insulating layer such as $Ta_2O_5$, is deposited on top of the lower electrode 122. Referring then to FIG. 10C, an electrode material 124a, which is made of titanium nitride or the like, is deposited on top of the capacitor material 123a. Referring finally to FIG. 10D, the capacitor material 123a and the electrode material 124a are etched to form the upper electrode 124 and the capacitor film 123.

Another example of the capacitor element having the MIM structure is such that a barrier layer, which is an insulating layer containing silicon and oxygen, is formed between an upper electrode and a capacitor film and between the capacitor film and a lower electrode (see Japanese Unexamined Patent Application Publication No. 2004-266010, for example).

This structure not only adds capacitance but also prevents oxygen deficiencies in the capacitor film which occurs at the interface between a dielectric and an electrode in order to avoid an increase in leakage current, capacitor element's temperature dependence and electric field dependence.

Still another example of the capacitor element having the MIM structure is such that an upper electrode and a capacitor film have a common end face and an interlayer film is formed between the capacitor film and a lower electrode so as to extend to the position at a certain distance inward from the end face (see Japanese Unexamined Patent Application Publication Nos. 2005-019831, 02-310958 and 02-144964, for example).

It is demanded for a recent SRAM to have small cells. Therefore, a VCC line, which is one of a power supply electrode, a GND line, which is the other one of the power supply electrode, and a node electrode are placed in close proximity.

In an SRAM, VCC lines and GND lines are formed in the mesh structure or the like in an upper layer of the device. If a power supply electrode of an SRAM doubles as a lower electrode of a capacitor element as described above, it is necessary to connect the lower electrode to the VDD line or the GND line placed thereabove.

Therefore, the upper electrode has an opening hole, so that the lower electrode of the capacitor element is connected with the power supply line placed thereabove by a vertical electrode which is placed in the opening hole. In such a case, the lower electrode is formed across the opening hole.

In the process of manufacturing the capacitor element having such a structure, the capacitor material 123a and the electrode material 124a, which are deposited sequentially on top of the lower electrode 122, are etched as described above with reference to FIGS. 10A to 10D. However, damage can occur in the capacitor film in the process of creating the opening hole of the upper electrode and the capacitor film by etching.

Further, because the end face of the upper electrode, which also serves as the inner side face of the opening hole, and the lower electrode cross each other in the above-described structure, an electric field concentration occurs there. If there is damage in the capacitor film where the electric field is concentrated, it can cause reduction of dielectric strength or the occurrence of leakage current in the capacitor element.

Furthermore, if an opening hole is created in the upper electrode and the capacitor film by etching, it can cause damage to occur in the lower electrode located at the opening hole, which deteriorates the characteristics. In the capacitor element disclosed in Japanese Unexamined Patent Application Publication No. 2005-019831 and so on, the lower electrode extends to the outside of the end face of the upper electrode and the capacitor film. Therefore, damage can occur in the lower electrode when etching the upper electrode and the capacitor film.

Japanese Unexamined Patent Application Publication No. 02-310958 discloses a capacitor element of the stacked structure. In this capacitor element, an insulating film is placed immediately below the end of an upper electrode and a capacitor film. In this technique, however, the capacitor film and a lower electrode are merely in contact with each other at an opening of the insulating film.

Further, in this capacitor element, an upper electrode is composed of two layers, and a natural silicon oxide film is placed between the capacitor film and the lower electrode.

Therefore, the capacitor element of Japanese Unexamined Patent Application Publication No. 02-310958 needs to have the four-layer structure composed of the upper electrode, the capacitor film, the natural silicon oxide film, and the lower electrode. Because the natural silicon oxide film is placed between the capacitor film and the lower electrode, the capacitance of the capacitor element decreases in this structure.

SUMMARY

In one embodiment, there is provided a semiconductor device that includes a capacitor element of an MIM (Metal-Insulator-Metal) structure with a stack of a lower electrode, a capacitor film and an upper electrode, the upper electrode and the capacitor film having a common end face, and the lower electrode projected outward from the end face of the upper electrode and the capacitor film, and a protective film made of a different material from the capacitor film, placed on top of the lower electrode in a part outside of the end face, extended to a position at a predetermined distance inward from the end face, and placed between the capacitor film and the lower electrode.

In another embodiment, there is provided a semiconductor device that includes a cell region where a plurality of memory cells are arranged in an array, a plurality of power supply electrodes formed for every given number of the memory cells and connected with the lower electrode, an upper-layer line located above the capacitor element and connected with the plurality of power supply electrodes, a tap region adjacent to the cell region, including a part where the plurality of power supply electrodes are connected with the upper-layer line, a capacitor element of an MIM structure with a stack of a lower electrode, a capacitor film and an upper electrode, said capacitor element formed for every given number of the memory cells and located at a boundary between the cell region and the tap region, and a protective film placed between the lower electrode and the capacitor film at the boundary between the cell region and the tap region.

In still another embodiment, there is provided a method of manufacturing the semiconductor device that includes a capacitor element of an MIM structure with a stack of lower electrode, a capacitor film and an upper electrode. The method includes forming the lower electrode to project outward from a common end face of the upper electrode and the capacitor film, depositing a protective material on top of the lower electrode, forming the protective film by etching the protective material so as to extend at a predetermined distance inward from the common end face of the upper electrode and the capacitor film, depositing a capacitor material made of a different material from the protective material and an electrode material sequentially on top of the lower electrode and the protective film, and forming the upper electrode and the capacitor film with the common end face by etching the capacitor material and the electrode material using a technique to stop etching at the protective film.

In the semiconductor device according to one embodiment of the present invention and the semiconductor device manufactured by a method according to one embodiment of the present invention, the capacitor film has a step-like portion near its end face due to the presence of the protective film. The step suppresses the progress of damage which occurs in the end face during etching of the upper electrode and the capacitor film. Further, the protective film prevents the occurrence of damage in the lower electrode during etching of the upper electrode and the capacitor film.

The semiconductor device of one embodiment of the present invention allows for the suppression of the progress of damage which occurs in the end face in the process of etching the upper electrode and the capacitor film at the step-like portion. It is thereby possible to prevent the reduction of dielectric strength or the occurrence of leakage current in the capacitor element even if electric field concentration occurs at the crossing point of the inner side face of the opening hole of the upper electrode and the lower electrode. It is also possible, by the protective film, to prevent the deterioration of characteristics due to the occurrence of damage in the lower electrode in the process of etching the upper electrode and the capacitor film.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A first embodiment of the present invention is described hereinafter with reference to FIGS. 1 to 4. In the description of the embodiment, the same elements as in the above-described related arts are designated the same way and the detailed description is not given thereon.

A semiconductor device of this embodiment comprises a capacitor element of an MIM (Metal-Insulator-Metal) structure with a stack of a lower electrode, a capacitor film and an upper electrode, the upper electrode and the capacitor film having a common end face, and the lower electrode projected outward from the end face of the upper electrode and the capacitor film, and a protective film made of a different material from the capacitor film, placed on top of the lower electrode in a part outside of the end face, extended to a position at a predetermined distance inward from the end face, and placed between the capacitor film and the lower electrode.

The semiconductor device of this embodiment also comprises a cell region where a plurality of memory cells are arranged in an array, a plurality of power supply electrodes formed for every given number of the memory cells and connected with the lower electrode, an upper-layer line located above the capacitor element and connected with the plurality of power supply electrodes, a tap region adjacent to the cell region, including a part where the plurality of power supply electrodes are connected with the upper-layer line, a capacitor element of an MIM structure with a stack of a lower electrode, a capacitor film and an upper electrode, said capacitor element formed for every given number of the memory cells and located at a boundary between the cell region and the tap region, and a protective film placed between the lower electrode and the capacitor film at the boundary between the cell region and the tap region.

Figure 1:
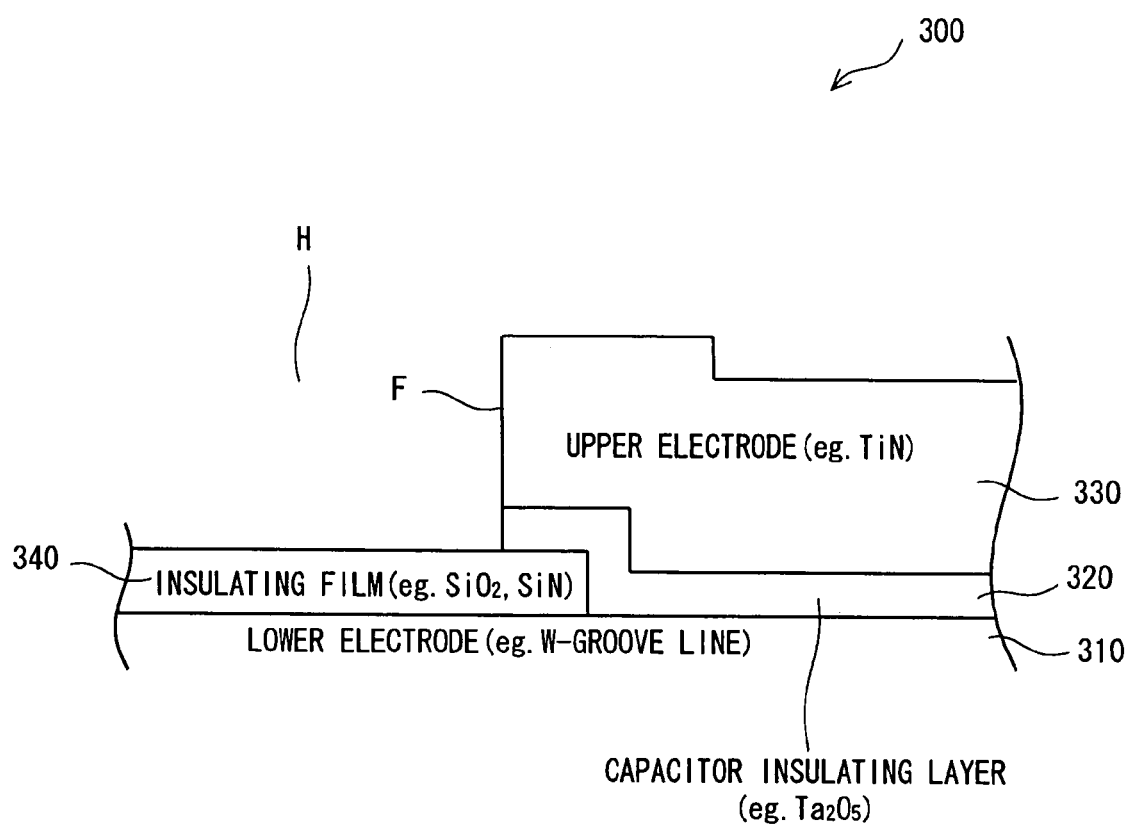
FIG. 1 is a longitudinal sectional front view schematically showing the structure of a capacitor element of an SRAM, which is a semiconductor device according to an embodiment of the present invention.

An SRAM (Static Random Access Memory) 200, which is a semiconductor device of this embodiment, includes a capacitor element 300 of the MIM (Metal-Insulator-Metal) structure where a lower electrode 310, a capacitor film 320 and an upper electrode 330 are placed on top of one another as shown in FIG. 1.

The upper electrode 330 and the capacitor film 320 have a common end face F. The lower electrode 310 projects outward from the end face F of the upper electrode 330 and the capacitor film 320. A protective film 340, which is made of a different material from the capacitor film 320, is formed on top of the part of the lower electrode 310 which is outside of the end face F.

Figure 2:
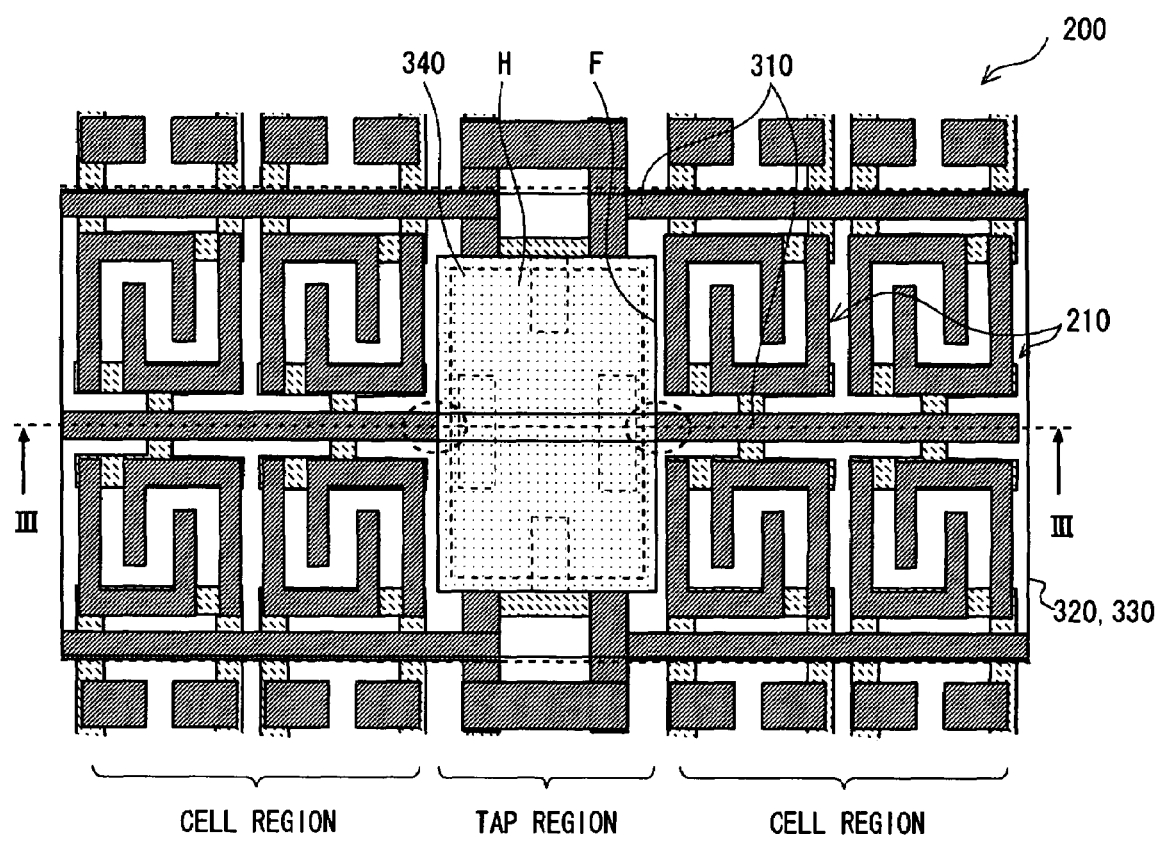
FIG. 2 is a top view of an SRAM.

The SRAM 200 of this embodiment includes a cell region, a power supply electrode, an upper-layer line, and a tap region as shown in such as FIG. 2. In the cell region, a plurality of memory cells 210 are arranged in an array. The power supply electrode is formed for every given number of memory cells 210 and is connected with the lower electrode 310. The upper-layer line is placed above the capacitor element 300 and is connected with a plurality of power supply electrodes. The tap region is adjacent to the cell region and it includes the part where the plurality of power supply electrodes are connected with the upper-layer line.

The capacitor element 300 is formed for every given number of memory cells 210 and is placed at the boundary between the cell region and the tap region. Further, the protective film 340 is placed between the lower electrode 310 and the capacitor film 320 at the boundary between the cell region and the tap region.

Specifically, in the SRAM 200 of this embodiment, the protective film 340 is placed between the capacitor film 320 and the lower electrode 310 so as to extend to a certain distance inward from the end face F. Thus, the capacitor film 320 and the upper electrode 330 have a crank-like stepped cross-sectional surface due to the presence of the protective film 340.

The thickness of the protective film 340 is larger than that of the capacitor film 320 and it is 100 nm or smaller, for example. Thus, the lower edge of the end face F of the capacitor film 320 is located above the inner upper surface of the capacitor film 320 which is spaced from the end face F.

Figure 3:
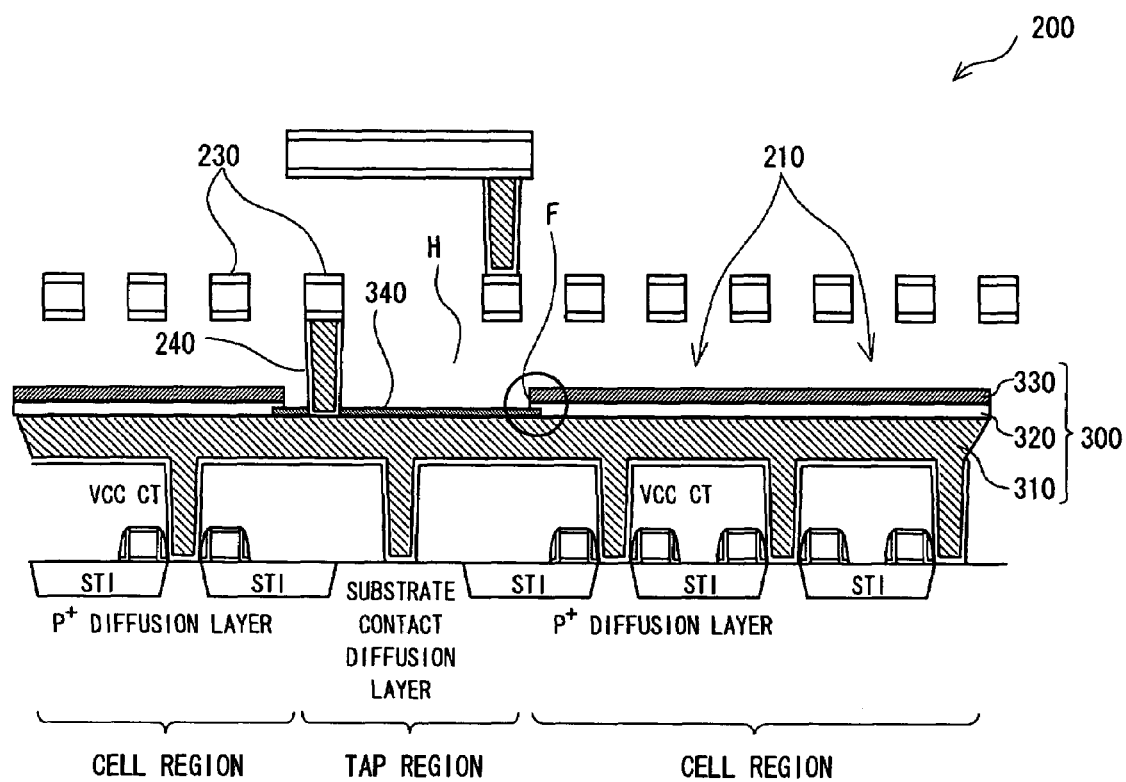
FIG. 3 is a longitudinal sectional front view along line III-III in FIG. 2.

As shown in FIGS. 2 and 3, a plurality of memory cells 210 are arranged in the SRAM 200 of this embodiment. The lower electrode 310 of the capacitor element 300 serves also as the power supply electrode which is connected with the plurality of memory cells 210. In order to prevent soft error in the memory cell 210, the capacitor element 300 is connected with the cross-coupling portion of the memory cell 210.

The plurality of memory cells 210 are arranged in matrix. The capacitor film 320 and the upper electrode 330 are formed uniformly in a prescribed region which overlaps with a given number of memory cells 210.

The upper electrode 330 and the capacitor film 320 have an opening hole H whose inner side face corresponds to the above-described end face F. The lower electrode 310 is formed across the opening hole H. As shown in FIG. 3, the power supply lines 230, which are composed of VCC lines and GND lines, are formed in the mesh or the like in the upper layer of the SRAM 200.

The power supply line 230 and the lower electrode 310 are connected by a vertical electrode 240 which penetrates the opening hole H of the upper electrode 330 and the capacitor film 320. The vertical electrode 240 penetrates the protective film 340 also.

The protective film 340 is made of a material that stops the etching of the upper electrode 330 and the capacitor film 320. Specifically, in the SRAM 200 of this embodiment, the lower electrode 310 is made of tungsten or the like. The capacitor film 320 is made of a capacitor insulating film such as $Ta_2O_5$. The upper electrode 330 is made of titanium nitride or the like. The protective film 340 is made of an insulating film such as $SiO_2$ or SiN.

A method of manufacturing the capacitor element 300 of the SRAM 200 according to this embodiment is briefly described hereinafter with reference to FIGS. 4A to 4F.

A method of manufacturing the semiconductor device of this embodiment comprises forming the lower electrode to project outward from a common end face of the upper electrode and the capacitor film, depositing a protective material on top of the lower electrode, forming the protective film by etching the protective material so as to extend at a predetermined distance inward from the common end face of the upper electrode and the capacitor film, depositing a capacitor material made of a different material from the protective material and an electrode material sequentially on top of the lower electrode and the protective film, and forming the upper electrode and the capacitor film with the common end face by etching the capacitor material and the electrode material using a technique to stop etching at the protective film.

Figure 4A:
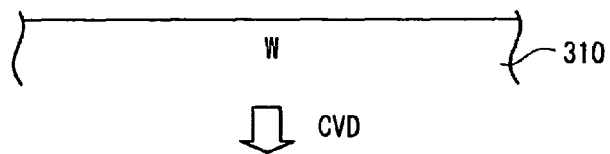
FIGS. 4A to 4F are longitudinal sectional front views schematically showing a manufacturing method of a capacitor element.
Figure 4B:
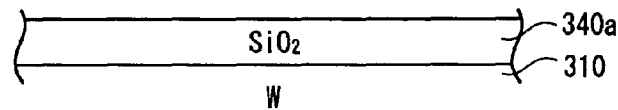

Referring first to FIG. 4A, the lower electrode 310, which is made of tungsten or the like, is formed to project outward from the end face F of the upper electrode 330 and the capacitor film 320. Referring next to FIG. 4B, a protective material 340a, which is made of SiO2, SiN or the like, is formed on top of the lower electrode 310 by CVD (Chemical Vapor Deposition) or the like.

Figure 4C:
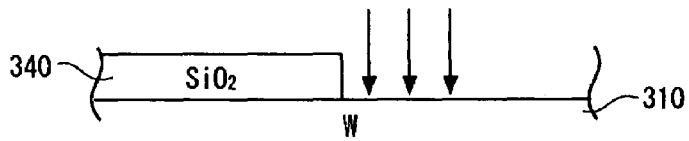

Referring then to FIG. 4C, the protective material 340a is etched such that it extends at a certain distance inward from the end face F of the upper electrode 330 and the capacitor film 320, thereby forming the protective film 340.

Figure 4D:
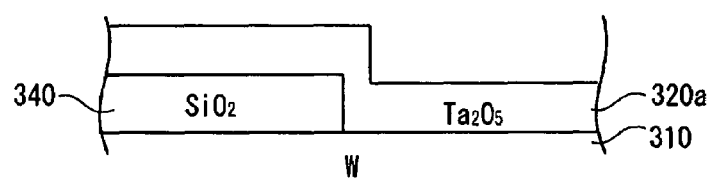
Figure 4E:
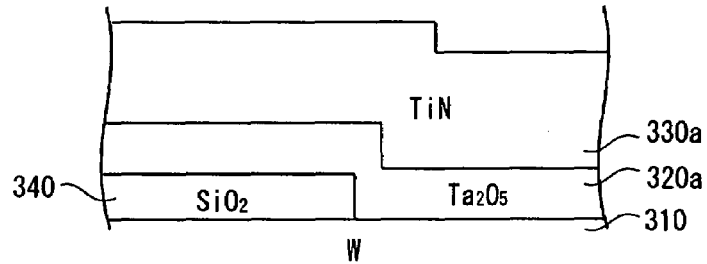

Referring further to FIG. 4D, a capacitor material 320a, which is made of $Ta_2O_5$ or the like, is formed on top of the lower electrode 310 and the protective film 340 by CVD or the like. Referring then to FIG. 4E, an electrode material 330a, which is made of titanium nitride or the like, is deposited on top of the capacitor material 320a by CVD, sputtering or the like.

Figure 4F:
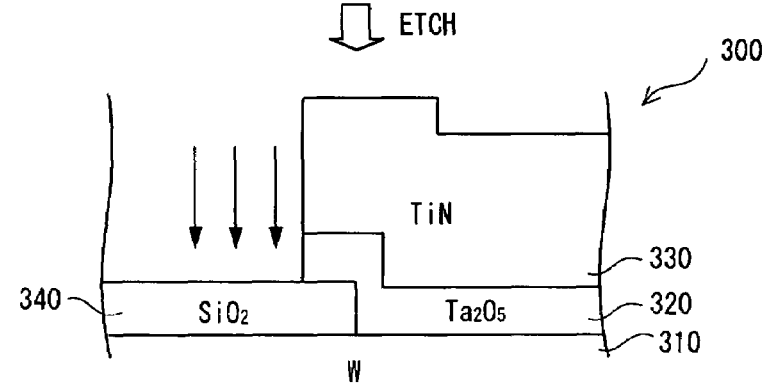
Figure 5:
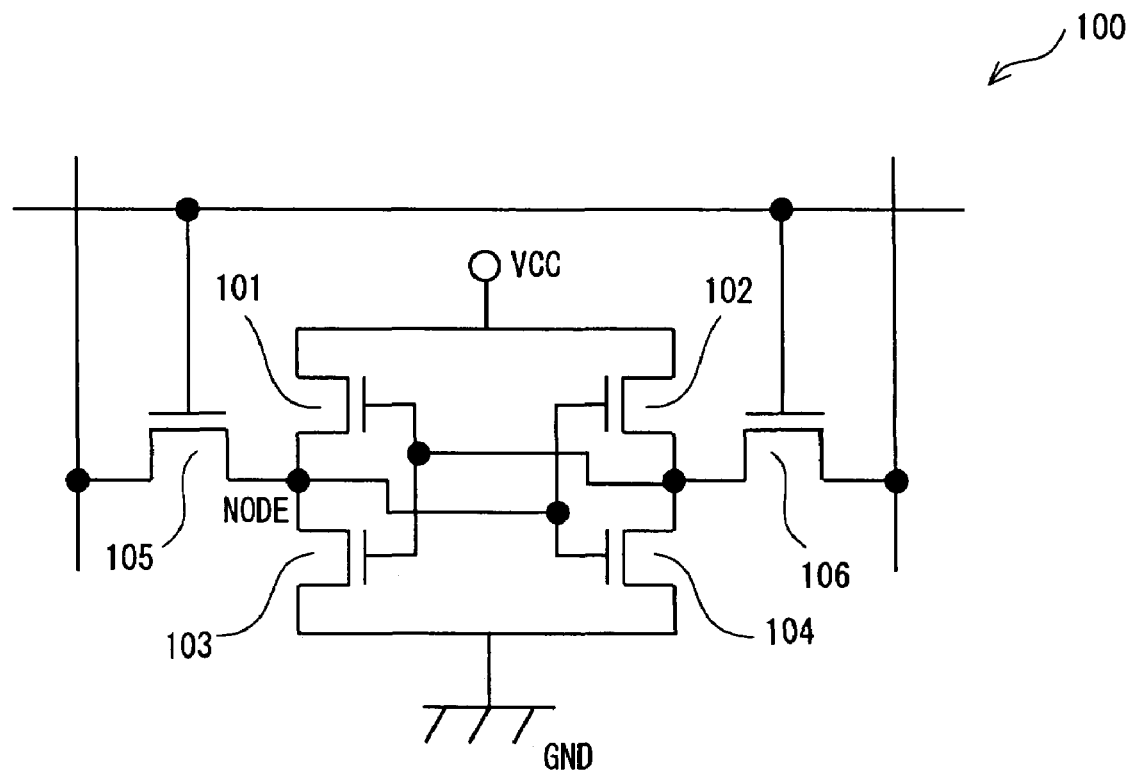
FIG. 5 is a circuit diagram showing the structure of a memory cell of an SRAM according to a related art.
Figure 6:
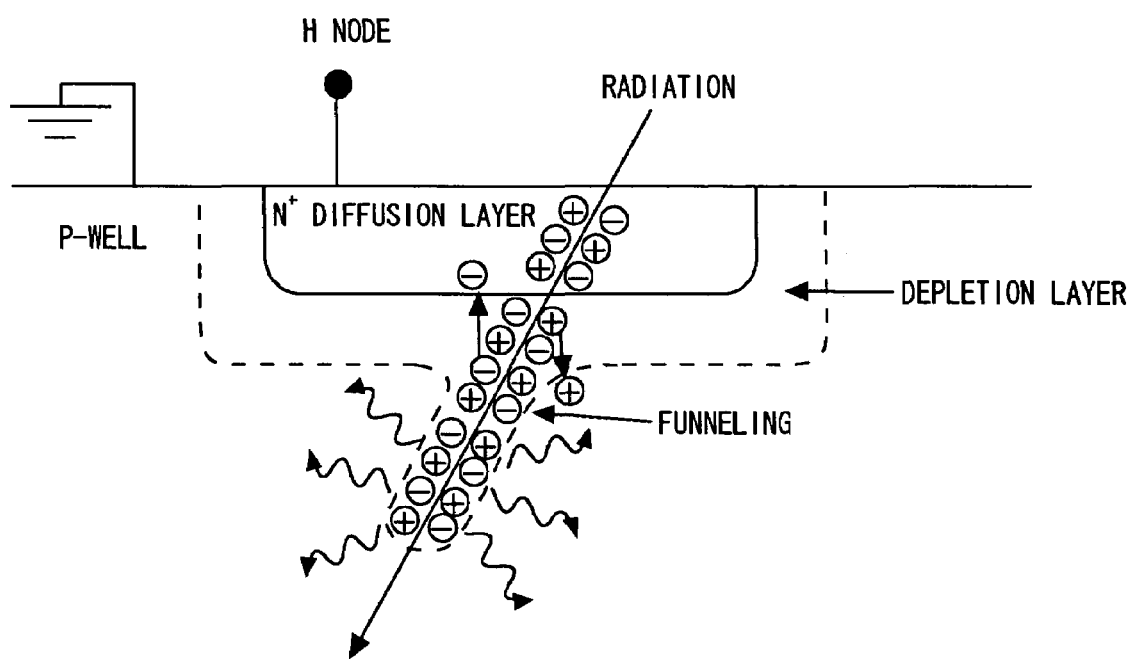
FIG. 6 is a view schematically showing the principle of the occurrence of soft error in a memory cell.
Figure 7:
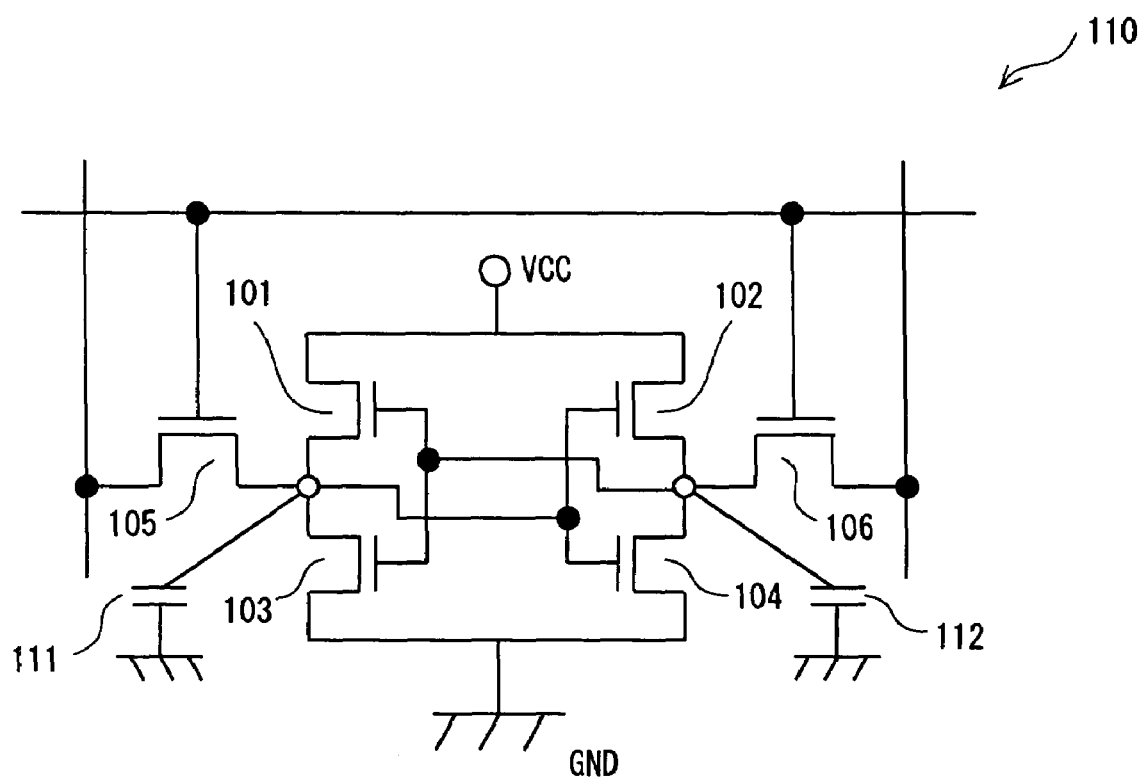
FIG. 7 is a circuit diagram showing the structure of a memory cell according to another related art.
Figure 8:
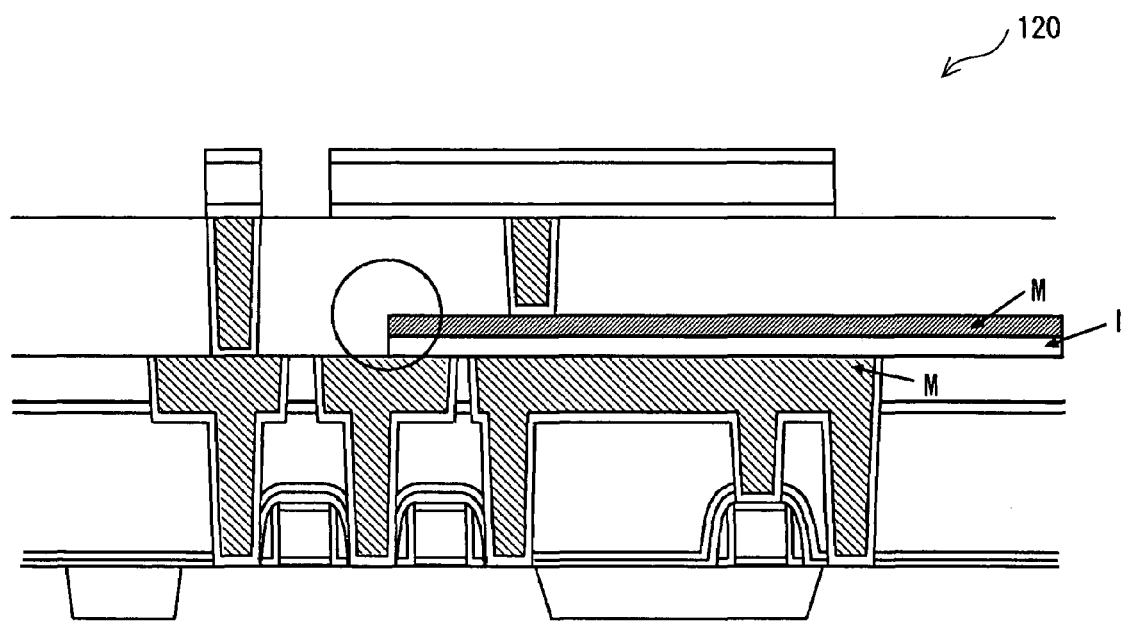
FIG. 8 is a longitudinal sectional front view showing the structure of an SRAM according to yet another related art.
Figure 9:
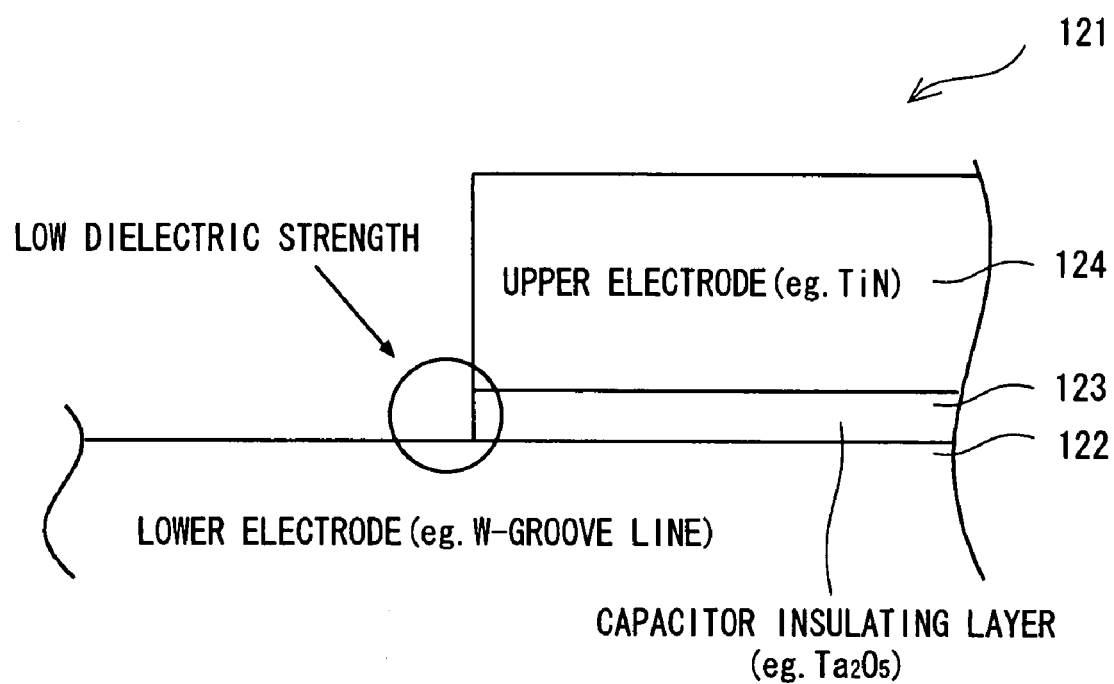
FIG. 9 is a longitudinal sectional front view showing the structure of a capacitor element of an SRAM.
Figure 10A:
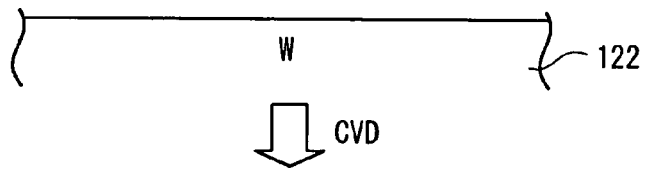
FIGS. 10A to 10D are longitudinal sectional front views schematically showing a manufacturing method of an SRAM.
Figure 10B:
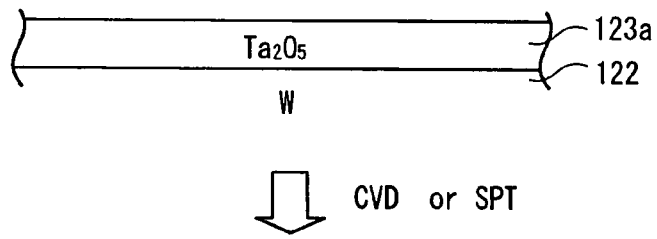
Figure 10C:
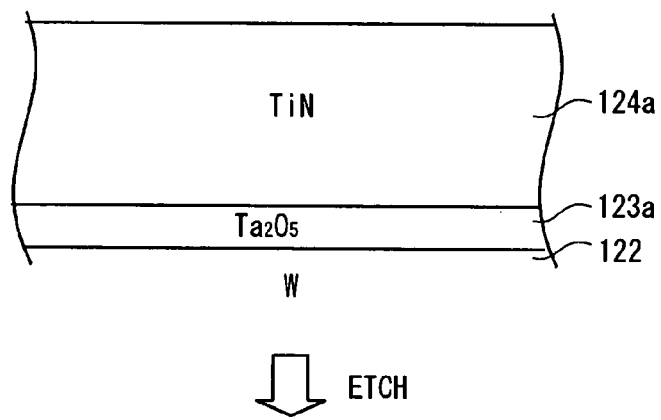
Figure 10D:
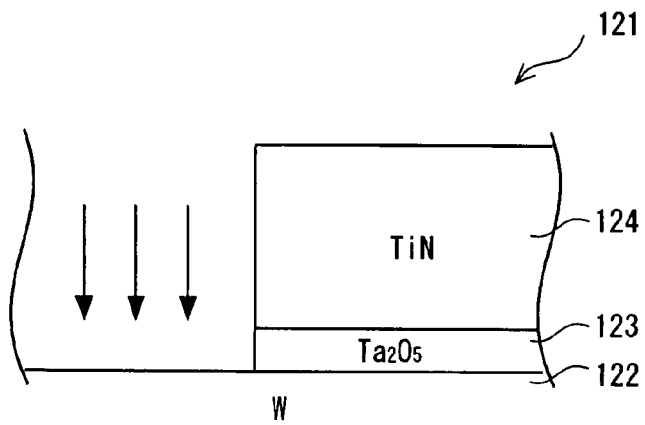

Referring finally to FIG. 4F, the capacitor material 320a and the electrode material 330a are etched to form the upper electrode 330 and the capacitor film 320. In this step, the protective film 340 serves as an etching stopper so that the etching does not affect the lower electrode 310.

In the SRAM 200 of this embodiment, the lower electrode 310 of the capacitor element 300 serves also as the power supply electrode which is connected with the plurality of memory cells 210. This eliminates the need for forming the lower electrode 310 separately for the capacitor element 300, which contributes to higher integration degree of the SRAM 200.

Further, the capacitor element 300 is connected to the cross coupling portion of the memory cells 210. This effectively prevents soft error in the memory cells 210.

Furthermore, the capacitor film 320 and the upper electrode 330 are formed uniformly in a prescribed region which overlaps with a given number of memory cells 210. The upper electrode 330 and the capacitor film 320 have the opening hole H whose inner side face corresponds to the above-described end face F.

The lower electrode 310 is formed across the opening hole H. It is thereby possible to connect the power supply line 230 in the upper layer with the lower electrode 310 by the vertical electrode 240 which penetrates the opening hole H.

In the SRAM 200 of this embodiment, the progress of the damage which has occurred in the end face F in the process of etching the upper electrode 330 and the capacitor film 320 is suppressed at the stepped surface which is created due to the presence of the protective film 340.

It is thereby possible to prevent the reduction of dielectric strength or the occurrence of leakage current in the capacitor element 300 even if the electric field concentration occurs at the crossing point of the inner side face of the opening hole H of the upper electrode 330 and the lower electrode 310.

Particularly, the protective film 340 is thicker than the capacitor film 320. Thus, the lower edge of the end face F of the capacitor film 320 is located above the inner upper surface of the capacitor film 320 which is spaced from the end face F. This prevents the damage of the end face F well due to the etching from progressing into the inside of the capacitor film 320 at the step-like portion created by the protective film 340.

Further, the capacitor element 300 does not need to have the four-layer structure entirely unlike the semiconductor device disclosed in Japanese Unexamined Patent Application Publication No. 02-310958. The protective film 340 is formed between the capacitor film 320 and the lower electrode 310 only in the part near the end face F. This prevents a decrease in capacitance of the capacitor element 300 due to the protective film 340.

Furthermore, the protective film 340 prevents the deterioration of the characteristics due to the occurrence of damage in the lower electrode 310 during etching of the upper electrode 330 and the capacitor film 320.

It is apparent that the present invention is not limited to the above embodiments, but may be modified and changed without departing from the scope and spirit of the invention.

What is claimed is:

1. A semiconductor device comprising:
a capacitor element of an MIM (Metal-Insulator-Metal) structure comprising a stack of a lower electrode, a capacitor film and an upper electrode, the upper electrode and the capacitor film having a common end face, and the lower electrode projected outward from the end face of the upper electrode and the capacitor film;
a protective film including a material which is different from a material of the capacitor film, placed on top of the lower electrode in a part outside of the end face, extended to a position at a predetermined distance inward from the end face, and placed between the capacitor film and the lower electrode; and
a cell region including a plurality of memory cells arranged in an array, an end of the protective film being formed at a boundary of the cell region.

2. The semiconductor device according to claim 1, wherein the plurality of memory cells are ranged in an array,
wherein the lower electrode of the capacitor element serves also as a power supply electrode connected with the plurality of memory cells, and
wherein the capacitor element is connected with the memory cells.

3. The semiconductor device according to claim 2, wherein the plurality of memory cells are arranged in a matrix,
wherein the capacitor film and the upper electrode are formed uniformly in a prescribed region overlapping with a predetermined number of memory cells,
wherein the upper electrode and the capacitor film have an opening hole with an inner side face being the end face of the upper electrode and the capacitor film, and
wherein the lower electrode is formed across the opening hole.

4. The semiconductor device according to claim 1, wherein the protective film comprises a thickness which is greater than a thickness of the capacitor film.

5. The semiconductor device according to claim 2, wherein the plurality of memory cells comprise SRAM (Static Random Access Memory) cells.

6. The semiconductor device according to claim 1, wherein the protective film comprises a material that is hard to be etched in a process of etching of the upper electrode and the capacitor film.

7. A semiconductor device comprising:
a cell region where a plurality of memory cells are arranged in an array;
a plurality of power supply electrodes formed for every given number of the memory cells and connected with the lower electrode;
an upper-layer line located above the capacitor element and connected with the plurality of power supply electrodes;
a tap region adjacent to the cell region, including a part where the plurality of power supply electrodes are connected with the upper-layer line;
a capacitor element of an MIM structure with a stack of a lower electrode, a capacitor film and an upper electrode, said capacitor element formed for every given number of the memory cells and located at a boundary between the cell region and the tap region; and
a protective film placed between the lower electrode and the capacitor film at the boundary between the cell region and the tap region.

8. The semiconductor device according to claim 7, wherein a material of the protective film is different from a material of the capacitor film.

9. The semiconductor device according to claim 7, wherein a thickness of the protective film is greater than a thickness of the capacitor film.

10. The semiconductor device according to claim 7, wherein the memory cells comprise SRAM (Static Random Access Memory) cells.

11. The semiconductor device according to claim 7, wherein the protective film comprises a material that is hard to be etched in the process of etching of the upper electrode and the capacitor film.

12. A method of manufacturing the semiconductor device according to claim 1, comprising:
forming the lower electrode to project outward from the end face of the upper electrode and the capacitor film;
depositing a protective material on top of the lower electrode;

forming the protective film by etching the protective material so as to extend at a predetermined distance inward from the end face of the upper electrode and the capacitor film;

depositing a capacitor material and an electrode material sequentially on top of the lower electrode and the protective film; and forming the upper electrode and the capacitor film by etching the capacitor material and the electrode material using a technique to stop etching at the protective film.

13. A method of manufacturing the semiconductor device including a capacitor element of an MIM structure with a stack of lower electrode, a capacitor film and an upper electrode, comprising:

forming the lower electrode to project outward from a common end face of the upper electrode and the capacitor film;

depositing a protective material on top of the lower electrode;

forming the protective film by etching the protective material so as to extend at a predetermined distance inward from the common end face of the upper electrode and the capacitor film, an end of the protective film being formed at a boundary of a cell region of the semiconductor device which includes a plurality of memory cells arranged in an array;

depositing a capacitor material comprising a material which is different from the protective material and an electrode material sequentially on top of the lower electrode and the protective film; and forming the upper electrode and the capacitor film with the common end face by etching the capacitor material and the electrode material using a technique to stop etching at the protective film.

14. The semiconductor device according to claim 1, wherein the lower electrode of the capacitor element is connected to a cross-coupling of the plurality of memory cells.

15. The semiconductor device according to claim 1, further comprising:

an other a cell region including a plurality of memory cells arranged in an array, another end of the protective film being formed at a boundary of the other cell region.

16. The semiconductor device according to claim 1, wherein a hole is formed in said upper electrode and said capacitor film, a wall of said hole being defined by said common end face.

17. The semiconductor device according to claim 16, further comprising:

a vertical electrode which connects a power supply line to said lower electrode of the capacitor element trough said hole in said upper electrode and said capacitor film.

18. The semiconductor device according to claim 1, wherein said protective film is formed between said common end face and said lower electrode.

19. The semiconductor device according to claim 1, wherein said capacitor film comprises:

a first portion near said common end face which is formed between said protective film and said upper electrode; and a second portion formed between said lower electrode and said upper electrode.

* * * * *